US006824174B2

United States Patent
Lin et al.

(10) Patent No.: US 6,824,174 B2
(45) Date of Patent: Nov. 30, 2004

(54) LATCH FOR REMOVING A COVER FROM A BASE

(75) Inventors: Kuo-Chih Lin, Tu-Chen (TW); Chen Lu Fan, Tu-Chen (TW); Li Ping Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 42 days.

(21) Appl. No.: 10/418,707

(22) Filed: Apr. 18, 2003

(65) Prior Publication Data

US 2004/0117946 A1 Jun. 24, 2004

(30) Foreign Application Priority Data

Dec. 20, 2002 (TW) ..................................... 91220806 U

(51) Int. Cl.[7] .............................................. E05C 19/06
(52) U.S. Cl. ........................ 292/85; 16/110.1; 16/429; 312/223.2
(58) Field of Search ............................ 292/83, 85, 124, 292/126, 224, 226; 312/223.2; 16/110.1, 429; 361/683, 725, 726

(56) References Cited

U.S. PATENT DOCUMENTS

| 832,284 A | * | 10/1906 | White ........................ 292/83 |
|---|---|---|---|
| 1,241,192 A | * | 9/1917 | Bruder ....................... 292/83 |
| 5,359,492 A | * | 10/1994 | Porter ....................... 361/683 |
| 5,740,012 A | * | 4/1998 | Choi .......................... 361/686 |
| 5,793,614 A | * | 8/1998 | Tollbom .................... 361/732 |
| 5,918,956 A | * | 7/1999 | Scholder .................. 312/223.2 |
| 6,354,680 B1 | * | 3/2002 | Lin et al. ................. 312/223.2 |
| 6,385,036 B1 | * | 5/2002 | Chien ........................ 361/683 |
| 6,398,325 B1 | * | 6/2002 | Chen et al. .............. 312/223.2 |
| 6,560,098 B1 | * | 5/2003 | Beinor et al. .............. 361/685 |
| 6,565,167 B1 | * | 5/2003 | Miller et al. ............. 312/332.1 |
| 6,637,847 B2 | * | 10/2003 | Crisp et al. ............. 312/223.2 |
| 6,648,149 B2 | * | 11/2003 | Robertson ................... 211/26 |

* cited by examiner

Primary Examiner—Chuck Y. Mah
Assistant Examiner—Michael J. Kyle
(74) Attorney, Agent, or Firm—Wei Te Chung

(57) ABSTRACT

A latch (10) for removing a cover from a base includes an operable member (20) fixed to the cover, and a stationary member (50) fixed to the base. The operable member includes a frame (30), and a handle (40) pivotably mounted therein. The handle includes a tongue (45) extending therefrom, and a pair of cams (44). The stationary member includes a pedestal (60), and a plate (70) fixed on the pedestal. The plate has a projection (72) formed thereon. The cover is removed from the base by rotating the handle. This causes the tongue to press the resilient plate and thus release the projection, and the cams of the handle to abut against the pedestal to urge the operable member to slide relative to the stationary member.

20 Claims, 3 Drawing Sheets

LATCH FOR REMOVING A COVER FROM A BASE

BACKGROUND OF THE INVENTION

1. Field of the Invention

The present invention relates to latches, and more particularly to a latch for readily removing a cover of a piece of electronic equipment from a base thereof.

2. Related Art

An item of electronic equipment, such as a personal computer or a server, generally comprises an enclosure for housing various electronic components. One purpose of the enclosure is to protect the components housed therein from physical damage. Another purpose is to prevent electromagnetic signals generated by components of the electronic equipment from escaping and causing EMI (electromagnetic interference) to other electronic devices in the vicinity of the electronic equipment. A further purpose is to prevent electromagnetic signals generated by other electronic devices in the vicinity of the electronic equipment from entering the electronic equipment and causing EMI to components of the electronic equipment.

The enclosure typically comprises a plurality of panels connected to each other with screws or similar fasteners. This inevitably slows down assembly of the enclosure, and increases costs in mass production facilities. In addition, the screws or other fasteners add to the inventory in a mass production facility. The more inventory items that need to be monitored, the higher the risk of production line shutdown in the event of a shortage of inventory.

Some electronic equipment enclosures adopt hooks to reduce or even eliminate the need for screws. Hooks formed on certain panels of the enclosure engage in recesses defined in other panels of the enclosure. Engaging forces between the hooks and the other panels at the recesses is generally large enough to ensure stability of the enclosure. However, panels of some large pieces of electronic equipment such as servers are quite thick, to prevent electromagnetic interference. These panels are correspondingly heavy, and the engaging forces of the hooks can be correspondingly high. This makes it difficult to manipulate the panels by hand in assembly or disassembly.

Thus, an engaging device for electronic equipment is desired to solve the above-mentioned problems.

SUMMARY OF THE INVENTION

Accordingly, an object of the present invention is to provide a latch for readily removing a cover of a piece of electronic equipment from a base thereof.

To achieve the above-mentioned object, a latch of the present invention for removing a cover from a base includes an operable member fixed to the cover, and a stationary member fixed to the base. The operable member comprises a frame, and a handle pivotably mounted thereto. The handle has a tongue extending therefrom, and a pair of cams. The stationary member includes a pedestal, and a resilient plate attached to the pedestal. The resilient plate forms a projection thereon. The cover is removed from the base by rotating the handle. This causes the tongue to press the resilient plate and thus release the projection, and the cams of the handle to abut against the pedestal to urge the operable member to slide relative to the stationary member.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
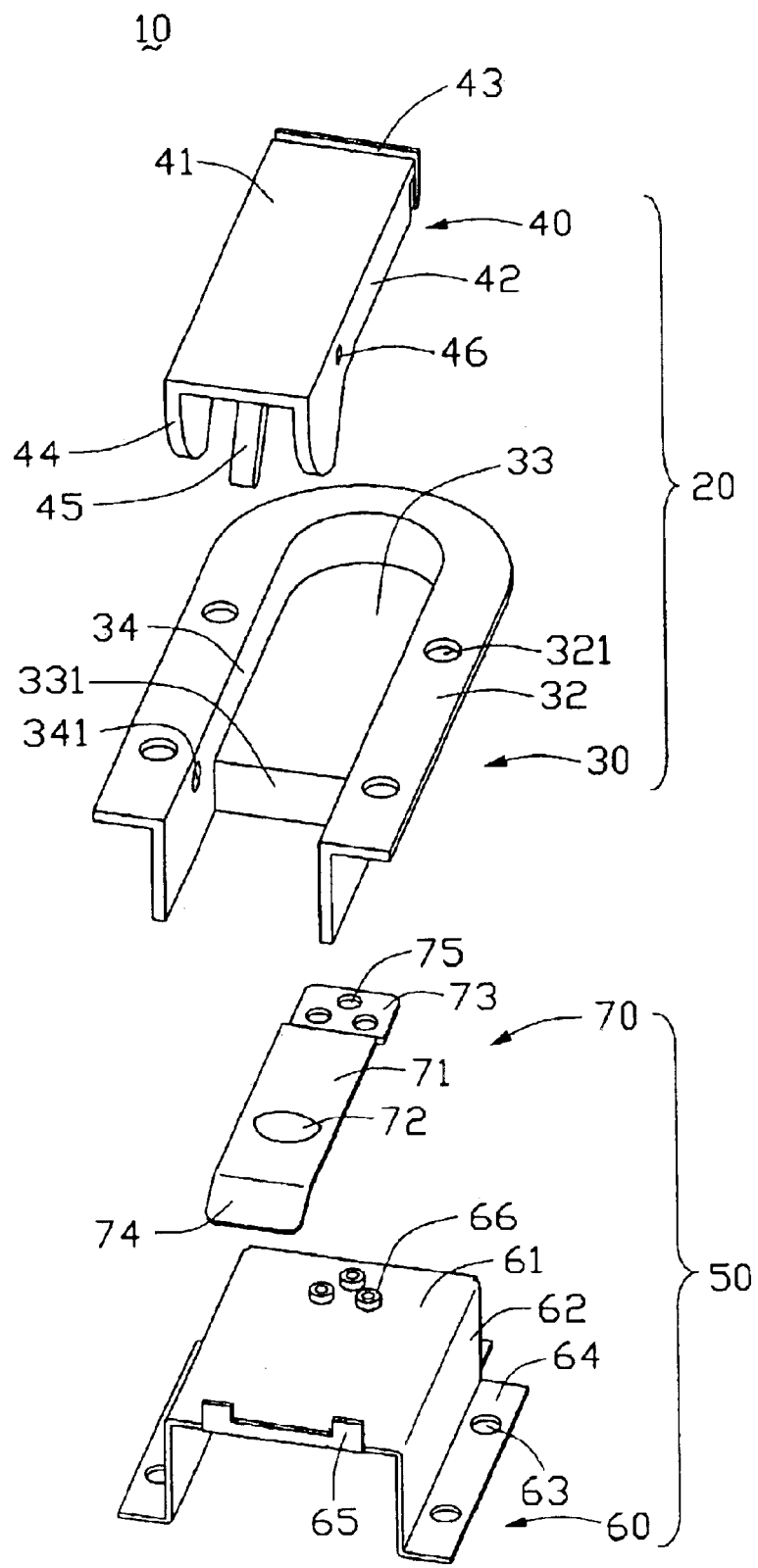
FIG. 1 is an exploded, isometric view of a latch of the present invention.
Figure 2:
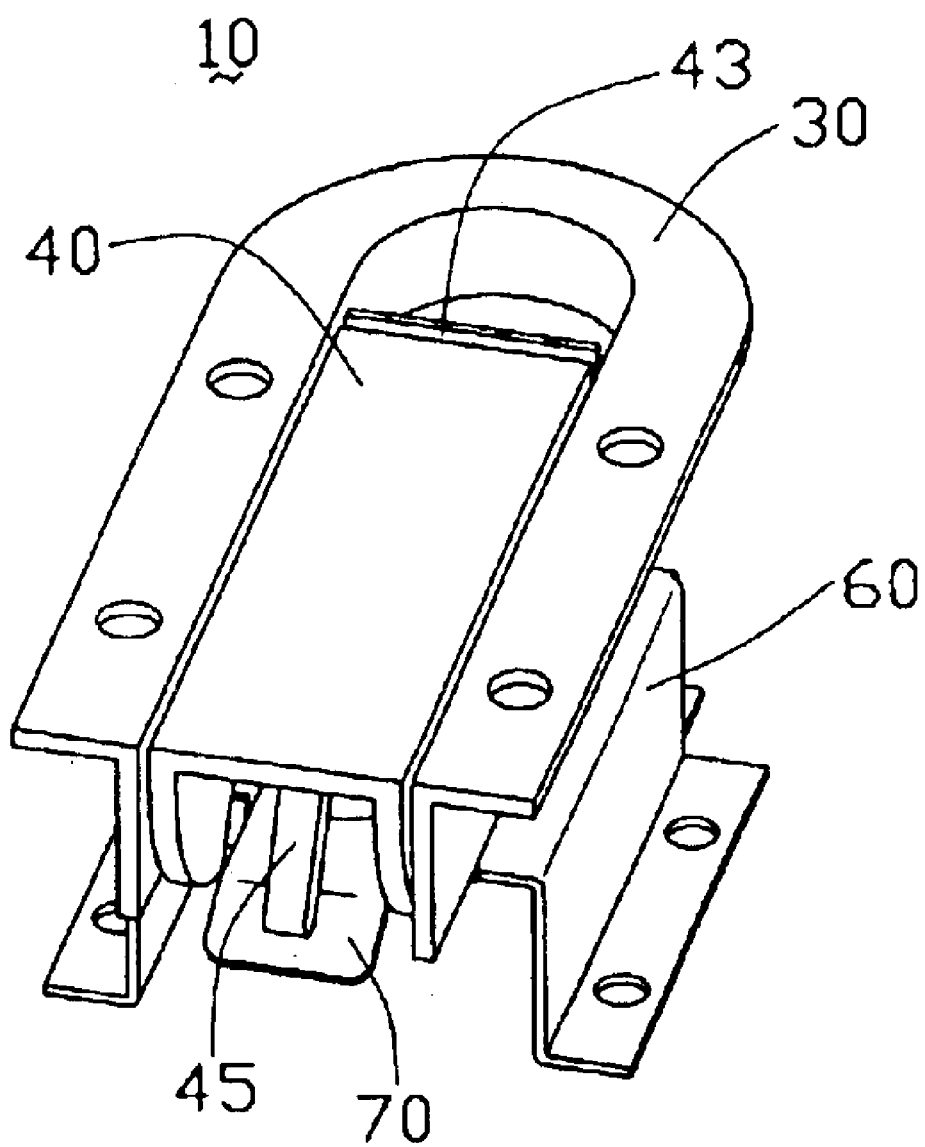
FIG. 2 is an assembled view of FIG. 1.
Figure 3:
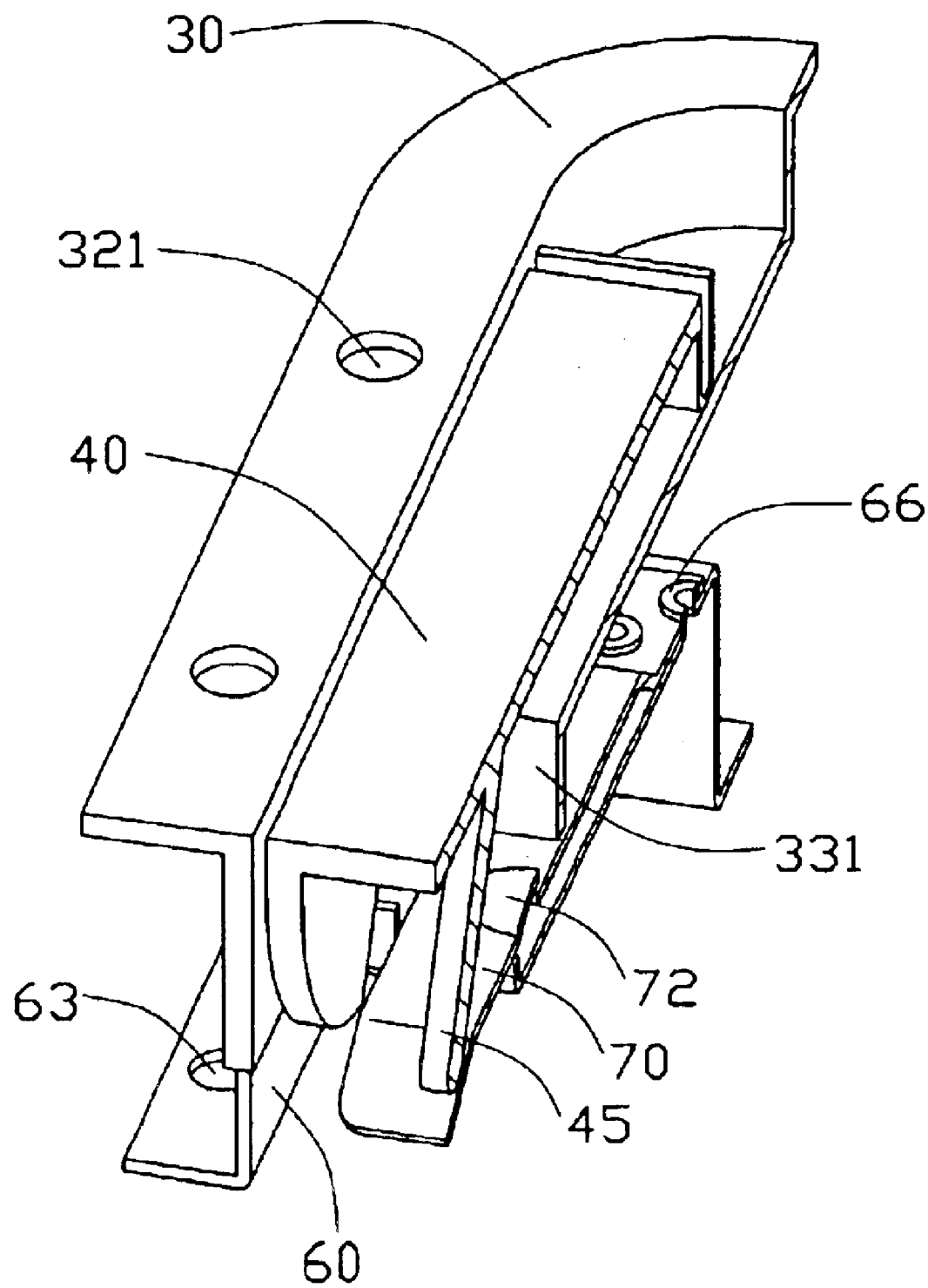
FIG. 3 is an enlarged, cut-away view of FIG. 2.

Referring to FIGS. 1–2, a latch 10 of the present invention comprises an operable member 20 fixed to a cover (not shown) of electronic equipment, and a stationary member 50 fixed to a base (not shown) of the electronic equipment. By means of operating the latch 10, the cover can be readily removed from the base.

The operable member 20 comprises a frame 30, and a handle 40 rotatably mounted in the frame 30. The frame 30 comprises an arch-shaped bottom wall 33, a U-shaped side wall 34 extending upwardly from a U-shaped periphery of the bottom wall 33, and a U-shaped flange 32 extending perpendicularly outwardly from a top edge of the side wall 34. The bottom wall 33 and side wall 34 cooperatively define an arch-shaped receiving cavity (not labeled) therebetween. A straight end of the bottom wall 33 is bent perpendicularly downwardly to form a peripheral wall 331. A pair of first pivot holes 341 is defined in opposite sides of the side wall 34 respectively, near the peripheral wall 331. A pair of positioning holes 321 is defined in each of opposite sides of the flange 32, for extension of fasteners such as screws (not shown) to engage the frame 30 with the cover.

The handle 40 comprises a top panel 41, a pair of side panels 42 depending from opposite lateral edges of the top panel 41 respectively, a U-shaped operable section 43 bent from a rear edge of the top panel 41, and a tongue 45 extending slantingly downwardly from an underside of the top panel 41. Each side panel 42 comprises a cam 44 at a front end thereof. A pair of second pivot holes 46 is defined the side panels 42 near the cams 44 respectively, corresponding to the first pivot holes 341 of the frame 30.

The stationary member 50 comprises a pedestal 60, and a resilient plate 70 attached to the pedestal 60. The pedestal 60 comprises a top plate 61, three side plates 62 depending from three edges of the top plate 61, and three flanges 64 bent perpendicularly outwardly from the side plates 62. A wide, generally U-shaped tab 65 is bent upwardly from a front edge of the top plate 61. The top plate 61 forms a plurality of columns 66 on an upper face thereof. The flanges 64 each define a pair of positioning holes 63, for extension of fasteners such as screws (not shown) therethrough to engage the pedestal 60 with the base.

The resilient plate 70 comprises a main body 71, a projection 72 protruding upwardly from the body 71, a slanted end 74 bent from an end of the body 71, and a fixing section 73 bent from an opposite end of the body 71. The fixing section 73 is generally parallel to but offset lower than the body 71, and defines a plurality of fixing holes 75 engagingly receiving the columns 66 of the pedestal 60. In the preferred embodiment of the present invention, the projection 72 is generally crescent-shaped.

In assembly of the operable member 20, the handle 40 is pivotally received in the frame 30, with two pins (not shown) being respectively extended through the second pivot holes 46 and corresponding first pivot holes 341. In assembly of the stationary member 50, the fixing holes 75 of the resilient plate 70 engagingly receive the columns 66 of the pedestal 60, thereby fixedly attaching the resilient plate 70 to the pedestal 60.

The operable member 20 and the stationary member 50 are fastened to the cover and base respectively of the electronic equipment by said screws (not shown). Then the cover is attached to the base, such that the projection 72 of the resilient plate 70 is located between the tongue 45 of the handle 40 and the peripheral wall 331 of the frame 30. The peripheral wall 331 blocks movement of the projection 72, thereby preventing the cover from sliding and being removed from the base unintentionally.

In operation, the operable portion 43 of the handle 40 is rotated upwardly, so that the tongue 45 presses the slanted end 74 of the plate 70 to elastically deform the resilient plate 70. As a result, the projection 72 is released from the peripheral wall 331 of the frame 30. The handle 40 is continued to be rotated, so that the cams 44 of the handle 40 abut against the tab 65 of the pedestal 60 to urge the operable member 20 to slide forwardly relative to the stationary member 50. The cover having the operable member 20 is then removable from the base having the stationary member 50.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A latch for removing a cover of electronic equipment from a base of the electronic equipment, the latch comprising:
    an operable member fixed to the cover, the operable member comprising a frame having a peripheral wall, and a handle pivotably mounted in the frame, the handle having a tongue; and
    a stationary member fixed to the base, the stationary member comprising a pedestal and a resilient plate attached to the pedestal, the resilient plate comprising a projection disposed between the peripheral wall and the tongue;
    wherein when the handle is rotated, the tongue presses the resilient plate to release the projection from the peripheral wall, so that the operable member can be moved relative to the stationary member to remove the cover from the base.

2. The latch as described in claim 1, wherein the handle further comprises a cam at a front end thereof, and a tab is bent upwardly from a front end of the pedestal for engaging with the cam to actuate the operable member to move relative to the stationary member.

3. The latch as described in claim 1, wherein the frame comprises an arch-shaped bottom wall, a U-shaped side wall extending upwardly from a U-shaped periphery of the bottom wall, and a U-shaped flange extending outwardly from a top edge of the side wall, and the flange defines a plurality of positioning holes for extension of fasteners therethrough to engage with the cover.

4. The latch as described in claim 3, wherein the pedestal has a top plate, three side plates depending from three edges of the top plate, and three flanges bent outwardly from the side plates, and the flanges define a plurality of positioning holes for extension of fasteners therethrough to engage with the base.

5. The latch as described in claim 4, wherein the handle has a top panel, a pair of side panels depending from opposite lateral edges of the top panel, and an operable section extending and bending from a rear edge of the top panel.

6. The latch as described in claim 5, wherein the side walls of the frame near the peripheral wall respectively define a pair of first pivot holes, and the side panels of the handle respectively define a pair of second pivot holes corresponding to the first pivot holes.

7. The latch as described in claim 5, wherein the tongue extends slantingly downwardly from an underside of the top panel.

8. The latch as described in claim 5, wherein the resilient plate has a body, a slanted end bent from an end of the body, and a fixing section bent from an opposite end of the body.

9. The latch as described in claim 8, wherein the peripheral wall is bent from a straight end of the bottom wall of the frame, and the projection protrudes from the body of the resilient plate and is crescent-shaped.

10. The latch as described in claim 8, wherein the top plate of the pedestal has a plurality of columns on an upper face thereof, the fixing section of the plate is parallel to but offset lower than the body, and the fixing section defines a plurality of fixing holes engagingly receiving the columns of the pedestal.

11. A latch for removing a cover of electronic equipment from a base of the electronic equipment, the latch comprising:
    an operable member fixed to the cover, the operable member comprising a frame, and a handle pivotably mounted to the frame, the handle having an urging section; and
    a stationary member fixed to the base, the stationary member comprising a pedestal and a tab formed on the pedestal;
    wherein when the handle is rotated, the urging section of the handle presses the tab of the stationary member to urge the operable member to move relative to the stationary member so that the cover can be removed from the base.

12. The latch as described in claim 11, wherein the urging section of the handle comprises a cam arranged at a front of the handle, and the tab is bent upwardly from a front end of the top plate of the pedestal for engaging with the urging section.

13. The latch as described in claim 11, wherein the handle further comprises a tongue extending slantingly downwardly therefrom.

14. The latch as described in claim 11, wherein the latch further comprises a resilient plate having a body, a slanted end bent from an end of the body, and a fixing section bent from an opposite end of the body.

15. The latch as described in claim 14, wherein a peripheral wall is bent from the frame, a crescent-shaped projection protrudes from the resilient plate.

16. The latch as described in claim 14, wherein the pedestal has a plurality of columns on an upper face thereof, the fixing section of the resilient plate is parallel to but offset lower than the body, and the fixing section defines a plurality of fixing holes engagingly receiving the columns of the pedestal.

17. The latch as described in claim 11, wherein opposite sides of the frame respectively define a pair of first pivot holes, and opposite sides of the handle respectively define a pair of second pivot holes corresponding to the first pivot holes.

18. A latch mechanism for use with first and second pieces to provide open and close statuses thereof, comprising:

an operable member including a frame adapted to be fixed to the first piece, and a handle pivotally mounted to the frame; and a stationary member including a pedestal adapted to be fixed to the second piece, and a deflectable latching device formed around the pedestal and being capable of preventing said operable member from moving relative to the stationary member along a direction; wherein by rotation of the handle, a portion of the handle deflects the latching device to no longer prohibit movement of the operable member along said direction, and another portion of the handle abuts against the stationary member to move said operable member relative to the stationary member along said direction.

19. The latch mechanism as described in claim 18, wherein said latching device is discrete from said pedestal.

20. The latch mechanism as described in claim 18, wherein said portion and said another portion are spaced from each other along another direction perpendicular to said direction.

* * * * *